(12) United States Patent
Hsu et al.

(10) Patent No.: US 9,401,326 B1
(45) Date of Patent: Jul. 26, 2016

(54) SPLIT CONTACT STRUCTURE AND FABRICATION METHOD THEREOF

(71) Applicant: INOTERA MEMORIES, INC., Taoyuan (TW)

(72) Inventors: Cheng-Yeh Hsu, New Taipei (TW); Hsin-Pin Huang, Hsinchu County (TW); Chih-Hao Cheng, New Taipei (TW)

(73) Assignee: INOTERA MEMORIES, INC., Guishan Dist., Taoyuan (TW)

( * ) Notice: Subject to any disclaimer, the term of this patent is extended or adjusted under 35 U.S.C. 154(b) by 0 days.

(21) Appl. No.: 14/720,830

(22) Filed: May 24, 2015

(51) Int. Cl.
| H01L 21/8242 | (2006.01) |
| H01L 23/528 | (2006.01) |
| H01L 23/532 | (2006.01) |
| H01L 27/108 | (2006.01) |

(52) U.S. Cl.
CPC ........ *H01L 23/528* (2013.01); *H01L 23/53209* (2013.01); *H01L 23/53295* (2013.01); *H01L 27/10844* (2013.01)

(58) Field of Classification Search
CPC ............ H01L 23/528; H01L 23/53295; H01L 23/5209; H01L 27/10844
See application file for complete search history.

(56) References Cited

U.S. PATENT DOCUMENTS

| 2003/0186526 | A1 | 10/2003 | Chang | |
| 2004/0036125 | A1* | 2/2004 | Oh | H01L 21/76897 257/382 |
| 2004/0065959 | A1 | 4/2004 | Park | |
| 2005/0233505 | A1 | 10/2005 | Seo | |
| 2006/0223297 | A1 | 10/2006 | Seo | |
| 2010/0210087 | A1* | 8/2010 | Sung | H01L 21/76897 438/381 |

* cited by examiner

*Primary Examiner* — Long Pham
(74) *Attorney, Agent, or Firm* — Winston Hsu; Scott Margo

(57) ABSTRACT

A split contact structure includes a semiconductor substrate having a major surface; a first upwardly protruding structure disposed on the major surface; a first cell contact region in the major surface and being close to the first upwardly protruding structure; a second upwardly protruding structure disposed on the major surface; a second cell contact region in the major surface and being close to the second upwardly protruding structure; a first patterned layer stacked on the first upwardly protruding structure; a second patterned layer stacked on the first upwardly protruding structure; a first contact structure disposed on a sidewall of the first upwardly protruding structure and being in direct contact with the first cell contact region; and a second contact structure disposed on a sidewall of the second upwardly protruding structure and being in direct contact with the second cell contact region.

6 Claims, 9 Drawing Sheets

US 9,401,326 B1

SPLIT CONTACT STRUCTURE AND FABRICATION METHOD THEREOF

BACKGROUND OF THE INVENTION

1. Field of the Invention

The present invention relates generally to a semiconductor device and a method of fabricating the same. More particularly, the present invention relates to a split contact structure and a dual-spacer process for fabricating such split contact structure.

2. Description of the Prior Art

As known in the art, dynamic random access memory (DRAM) is a type of random-access memory that stores each bit of data in a separate capacitor within an integrated circuit. DRAM is usually arranged in a rectangular array of charge storage cells consisting of one capacitor and transistor per data bit.

Normally, each transistor of a DRAM cell comprises a gate, a drain region in a semiconductor substrate, and a source region spaced apart from the drain region. The gate is typically electrically connected to a word line. The source region is typically electrically connected to a digit line. The drain region is typically electrically connected to a capacitor through a cell contact structure.

Continued demand to shrink devices has facilitated the design of DRAM cells with greater density and smaller feature size and cell area. The dimension of the cell contact structure also shrinks dramatically, resulting in increased contact resistance and reduced process window.

Therefore, there is a need in this technical field to provide an improved cell contact structure for DRAM devices, which is capable of avoiding the above-mentioned prior art issues without increasing the complexity of the fabrication process.

SUMMARY OF THE INVENTION

It is one object of the invention to provide an improved split cell contact structure and fabrication method thereof in order to solve the above-mentioned prior art problems.

According to one aspect of the invention, a split contact structure includes a semiconductor substrate having a major surface; a first upwardly protruding structure disposed on the major surface; a first cell contact region in the major surface and being close to the first upwardly protruding structure; a second upwardly protruding structure disposed on the major surface; a second cell contact region in the major surface and being close to the second upwardly protruding structure; a first patterned layer stacked on the first upwardly protruding structure; a second patterned layer stacked on the first upwardly protruding structure; a first contact structure disposed on a sidewall of the first upwardly protruding structure and being in direct contact with the first cell contact region, wherein the first patterned layer protrudes from a top surface of the first contact structure; and a second contact structure disposed on a sidewall of the second upwardly protruding structure and being indirect contact with the second cell contact region, wherein the second patterned layer protrudes from a top surface of the second contact structure.

According to one embodiment, the first and second upwardly protruding structures extend along a first direction and the first and second patterned layers have a line-shaped pattern and extend along a second direction, wherein the first direction is perpendicular to the second direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above and other aspects and features of the present invention will become apparent by describing in detail exemplary embodiments thereof with reference to the attached drawings, in which.

Figure 1:
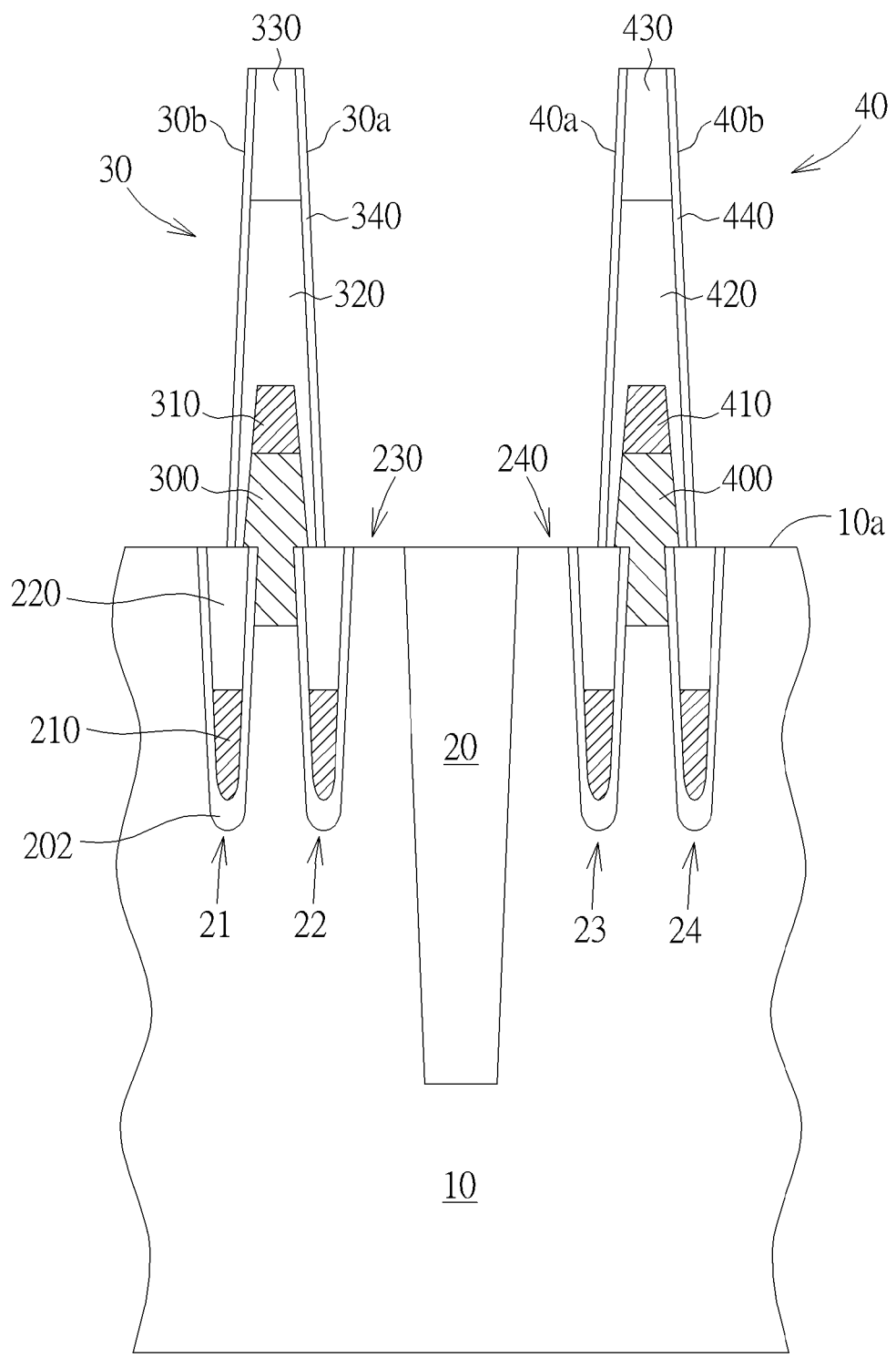
FIG. 1 to FIG. 9 are schematic, cross-sectional diagrams showing an exemplary method for fabricating a split contact structure for DRAM devices in accordance with one embodiment of the invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

With regard to the fabrication of transistors and integrated circuits, the term "major surface" refers to that surface of the semiconductor layer in and above which a plurality of transistors are fabricated, e.g., in a planar process. As used herein, the term "vertical" means substantially orthogonal with respect to the major surface. Typically, the major surface is along a <100> plane of a monocrystalline silicon layer on which the field-effect transistor devices are fabricated.

FIG. 1 to FIG. 9 are schematic, cross-sectional diagrams showing an exemplary method for fabricating a split contact structure for DRAM devices in accordance with one embodiment of the invention. As shown in FIG. 1, a semiconductor substrate 10 such as a silicon substrate is provided. It is to be understood that the semiconductor substrate 10 may be composed of any suitable semiconductor materials or wafers known in the art. The semiconductor substrate 10 has a major surface 10a, on which two upwardly protruding structures 30 and 40 are formed.

According to the illustrative embodiment, the two upwardly protruding structures 30 and 40 protrude from the major surface 10a and are disposed in close proximity to each other. When viewed from above, the upwardly protruding structures 30 and 40 may extend along a first direction and arranged parallel to each other. When viewed from above, the upwardly protruding structures 30 and 40 may have a wave-shaped pattern. It is to be understood that only two upwardly protruding structures are illustrated for simplicity.

According to the illustrative embodiment, the upwardly protruding structure 30 may comprise a silicon lower portion 300, a metal portion 310 directly on the silicon lower portion 300, and a silicon nitride layer 320 stacked on the metal portion 310 and covering the sidewalls of the metal portion 310. A silicon oxide layer 330 is stacked directly on the silicon nitride layer 320. A silicon nitride liner 340 may be provided to cover the sidewalls of the silicon oxide layer 330 and the silicon nitride layer 320. The upwardly protruding structure 30 has two opposite sidewall surfaces 30a and 30b.

According to the illustrative embodiment, the upwardly protruding structure 40 may comprise a silicon lower portion 400, a metal portion 410 directly on the silicon lower portion 400, and a silicon nitride layer 420 stacked on the metal portion 410 and covering the sidewalls of the metal portion 410. A silicon oxide layer 430 is stacked directly on the silicon nitride layer 420. A silicon nitride liner 440 may be provided to cover the sidewalls of the silicon oxide layer 430 and the silicon nitride layer 420. The upwardly protruding structure 40 has two opposite sidewall surfaces 40a and 40b.

It is to be understood that the upwardly protruding structures 30 and 40 are for illustration purposes only. According to the illustrative embodiment, the metal portion 310 directly on the silicon lower portion 300 and the metal portion 410 directly on the silicon lower portion 400 may act as a digit line of the DRAM device, but not limited thereto.

When viewed from above, the silicon oxide layer 330 and the silicon oxide layer 430 may extend along a second direction and arranged parallel to each other. According to the illustrative embodiment, the first direction is perpendicular to the second direction, but not limited thereto. According to the illustrative embodiment, the silicon oxide layers 330 and 430 may be formed by using spin-on-dielectric (SOD) materials, but not limited thereto. The silicon oxide layers 330 and 430 are patterned layer and may both have a line-shaped pattern.

According to the illustrative embodiment, shallow trench isolation (STI) structure 20 and a plurality of trenched gate structures 21, 22, 23, and 24 are provided in the semiconductor substrate 10 under the major surface 10a. 24. Each of the trenched gate structures 21, 22, 23, and 24 may comprise a gate dielectric layer 202, a conductive layer 210, and a cap layer 220.

According to the illustrative embodiment, a cell contact region 230 is provided adjacent to the trenched gate structure 22 and a cell contact region 240 is provided adjacent to the trenched gate structure 23. It is to be understood that the arrangement of the STI structure 20 and the plurality of trenched gate structures 21, 22, 23, and 24 are for illustration purposes only.

Figure 2:
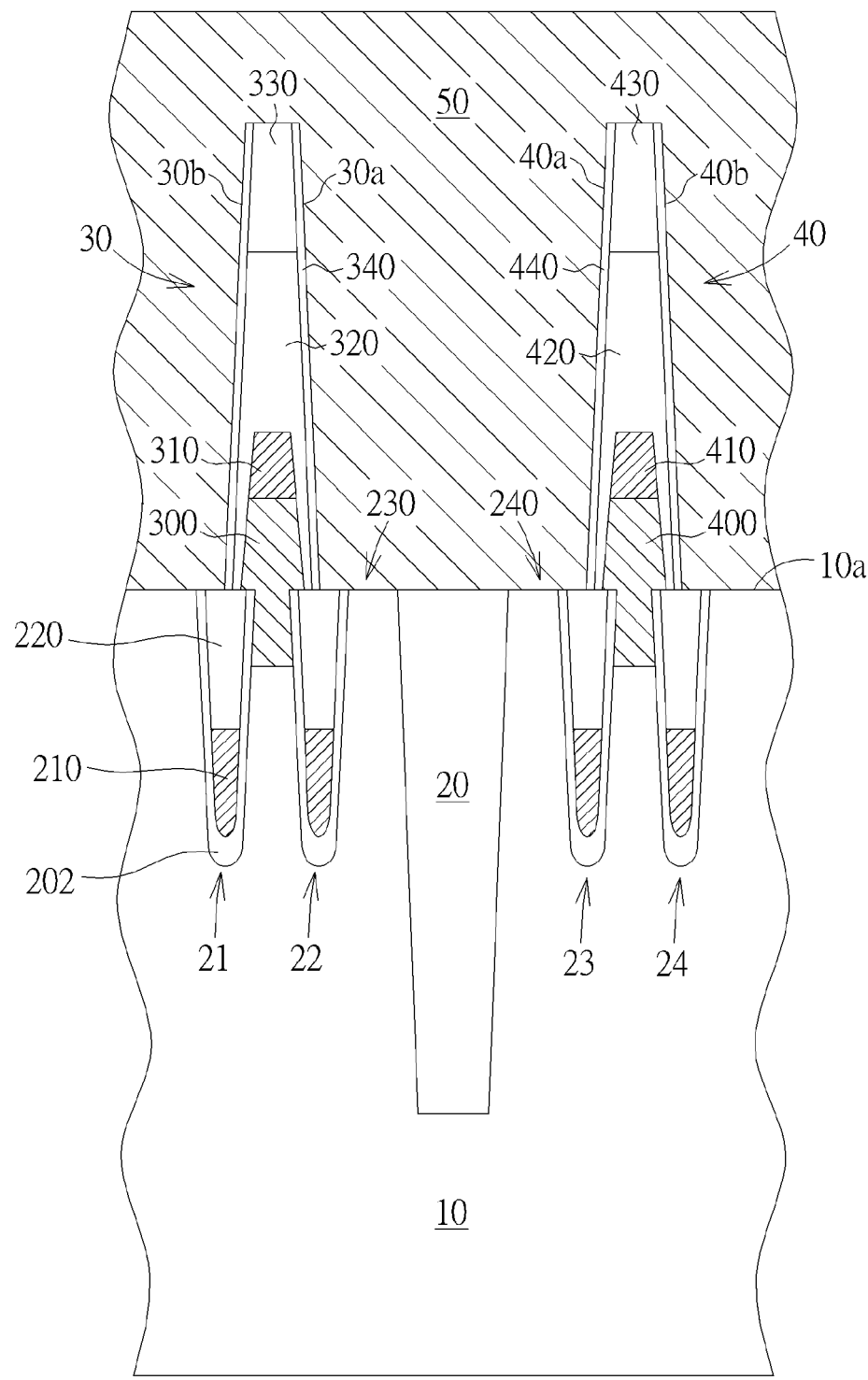

As shown in FIG. 2, according to the illustrative embodiment, a chemical vapor deposition (CVD) process may be carried out to deposit a polysilicon layer 50 on the semiconductor substrate 10. The polysilicon layer 50 covers the two upwardly protruding structures 30 and 40, the silicon oxide layers 330 and 430, as well as the major surface 10a including the STI structure 20 and the cell contact regions 230 and 240.

Figure 3:
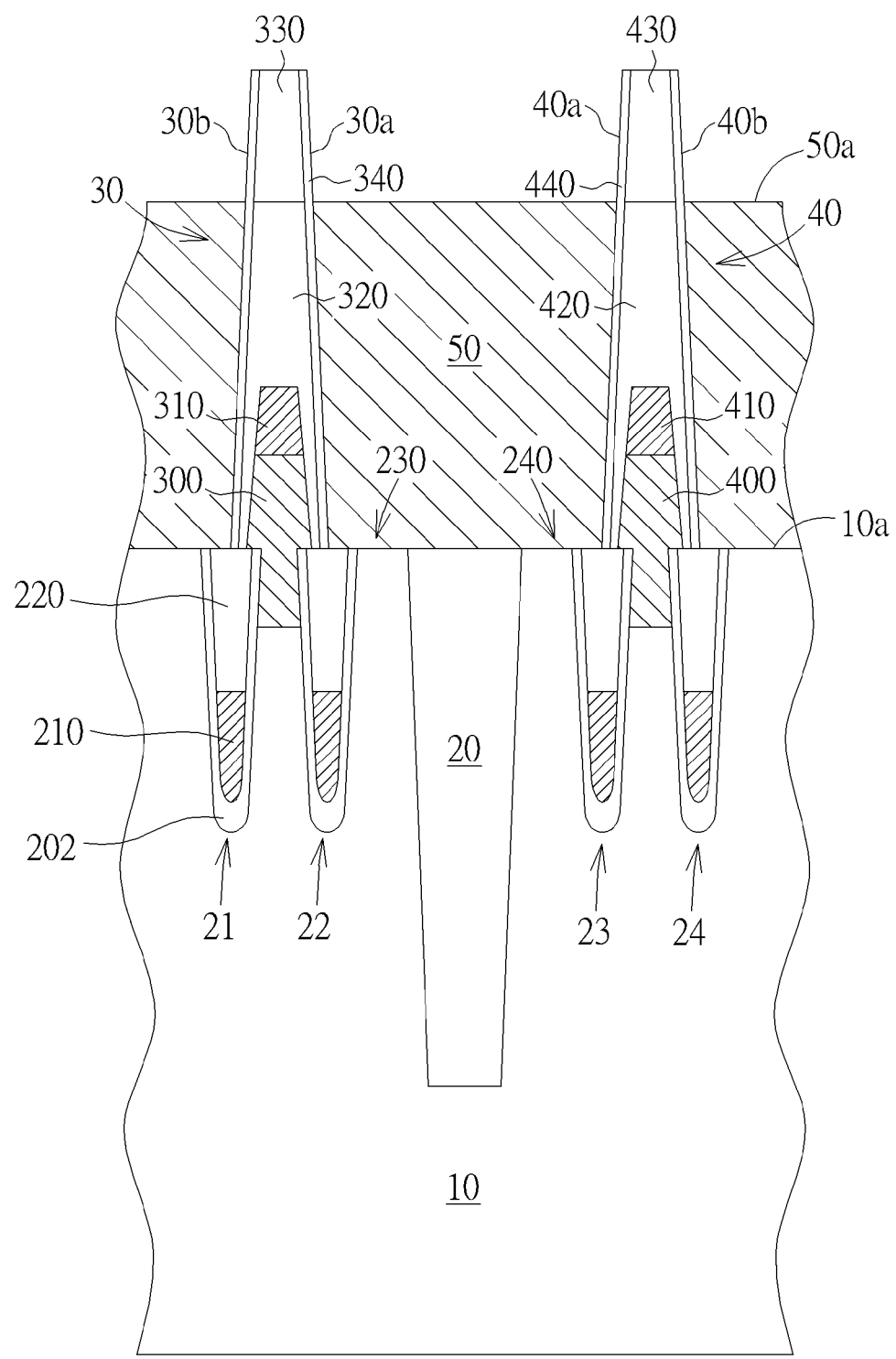

As shown in FIG. 3, according to the illustrative embodiment, the polysilicon layer 50 is then etched back to reveal the silicon oxide layers 330 and 430. After the etch back of the polysilicon layer 50, a top surface 50a of the polysilicon layer 50 may be flush with or lower than the oxide layers 330 and 430. At this point, the oxide layers 330 and 430 protrude from the top surface 50a of the polysilicon layer 50.

Figure 4:
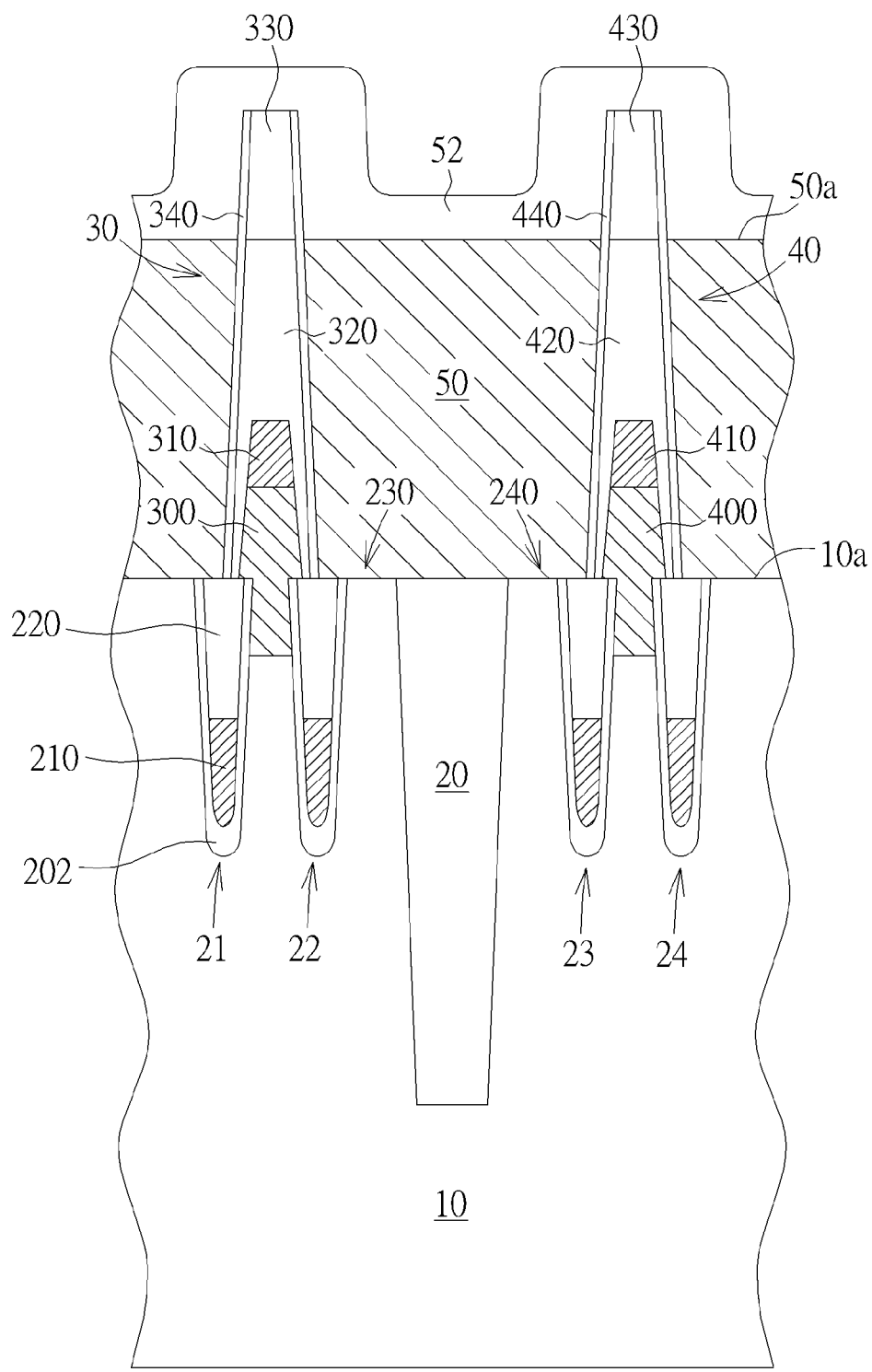

As shown in FIG. 4, according to the illustrative embodiment, another CVD process is then performed to deposit a conformal spacer layer 52 such as a silicon nitride layer on the top surface 50a of the polysilicon layer 50 and on the protrudent oxide layers 330 and 430. The thickness of the deposited spacer layer 52 carefully controlled according to the desired target thickness of the cell contact to be formed in a later stage.

Figure 5:
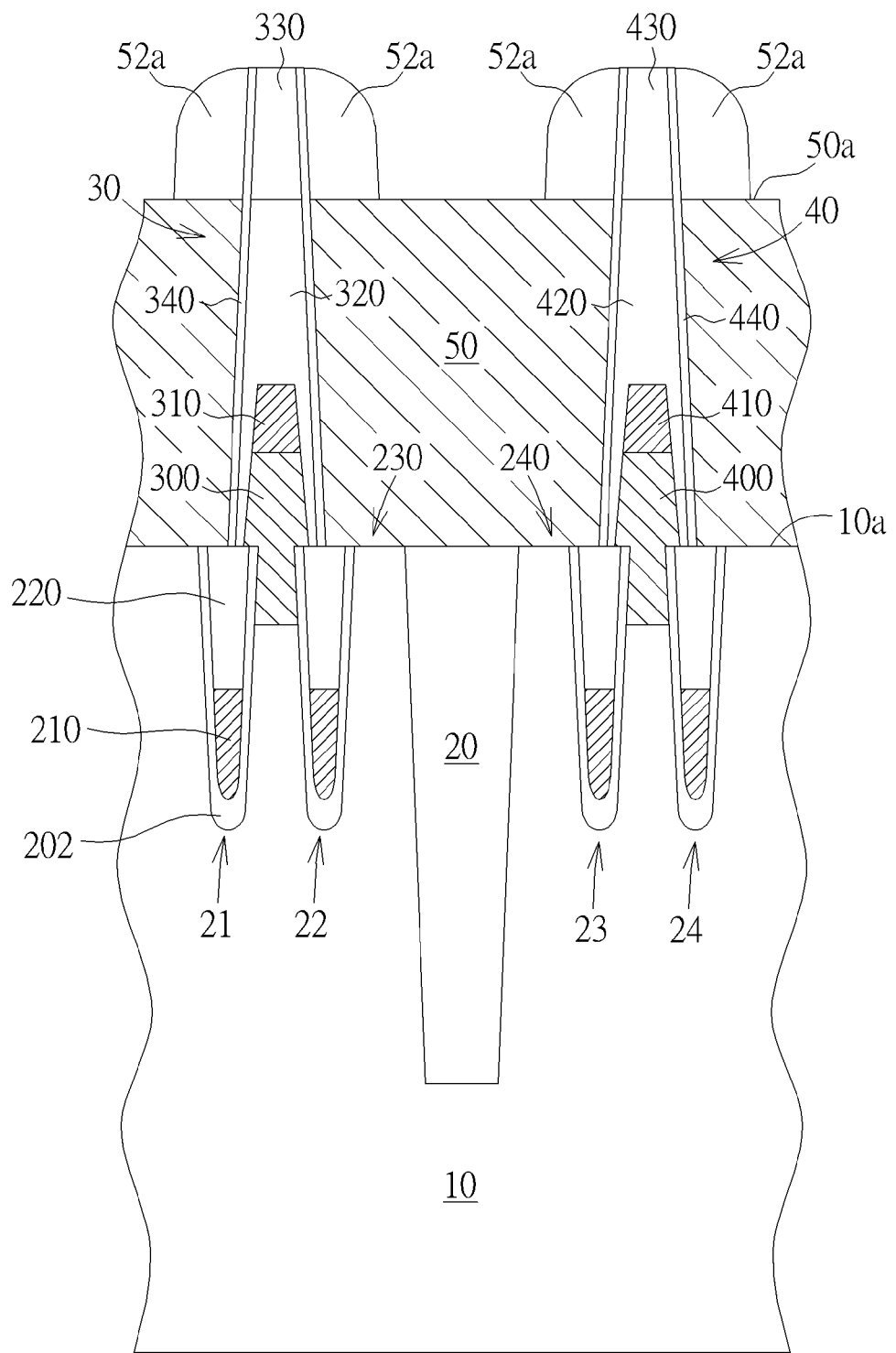

As shown in FIG. 5, subsequently, an anisotropic dry etching process is performed to etch the spacer layer 52 until the top surface 50a of the polysilicon layer 50 is exposed, thereby forming spaces 52a on two opposite sidewalls of the oxide layers 330 and 430.

Figure 6:
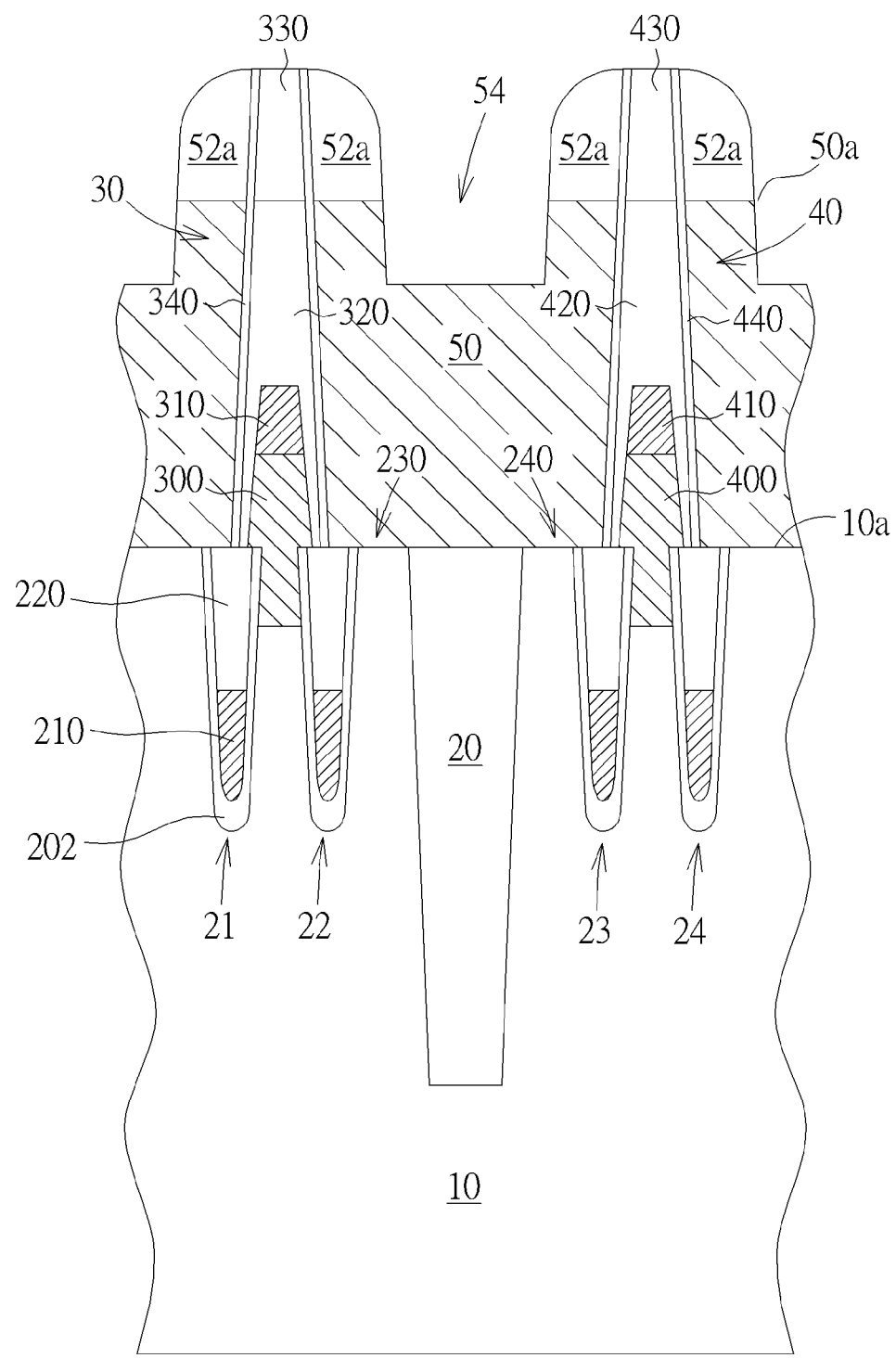

As shown in FIG. 6, according to the illustrative embodiment, another dry etching process may be performed, using the spacer layer 52 as an etching hard mask, to partially etch away a top portion of the polysilicon layer 50 not covered by the spacers 52a in a self-aligned manner. After the partial etch of the polysilicon layer 50, a recess 54 is formed in the polysilicon layer 50.

Figure 7:
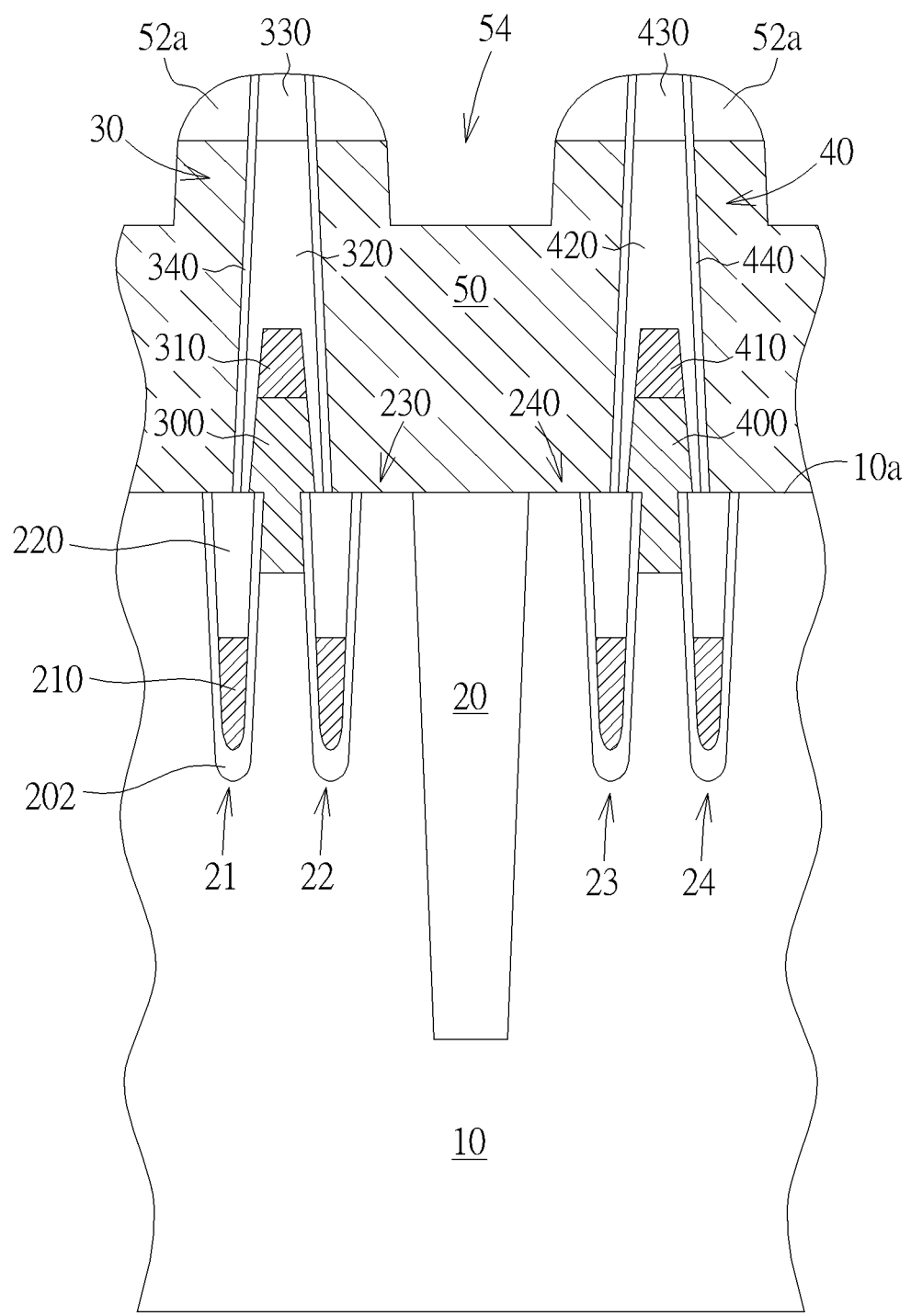

As shown in FIG. 7, optionally, after the partial etch of the polysilicon layer 50, according to the illustrative embodiment, a portion of the spacers 52a and a portion of the oxide layers 330 and 430 may be etched away. According to the illustrative embodiment, the removal of the portion of the spacers 52a may use wet etching methods known in the art, but not limited thereto.

Figure 8:
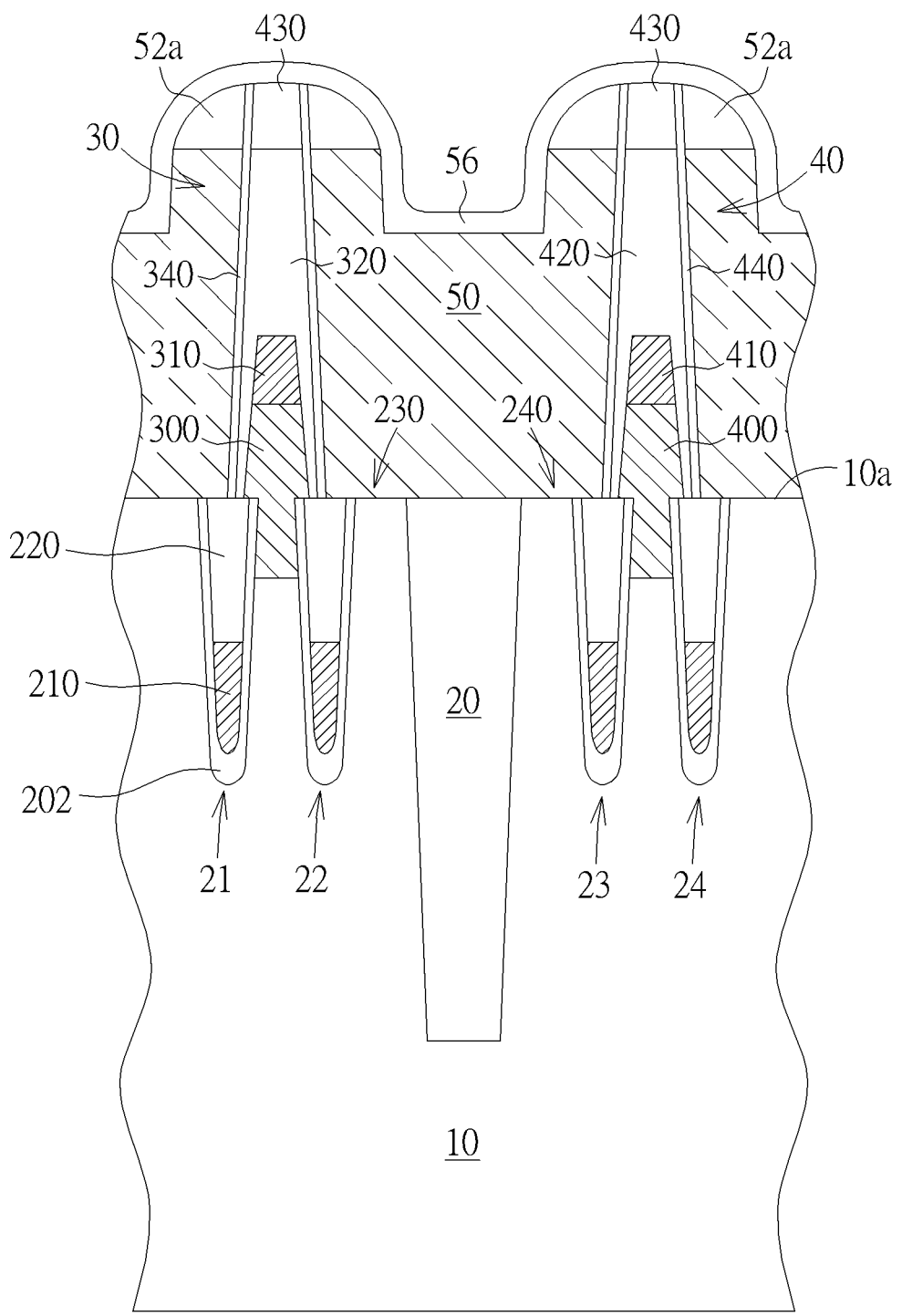

As shown in FIG. 8, according to the illustrative embodiment, another CVD process may be carried out to deposit a spacer layer 56 on the spacers 52a and in the recess 54. According to the illustrative embodiment, the spacer layer 56 conformally covers spacers 52a, the oxide layers 330 and 430, and the interior surface of the recess 54. The spacer layer 56 does not fill up the recess 54. According to the illustrative embodiment, the spacer layer 56 may comprise silicon nitride, silicon oxynitride, silicon oxide, or silicon carbide, but not limited thereto.

Figure 9:
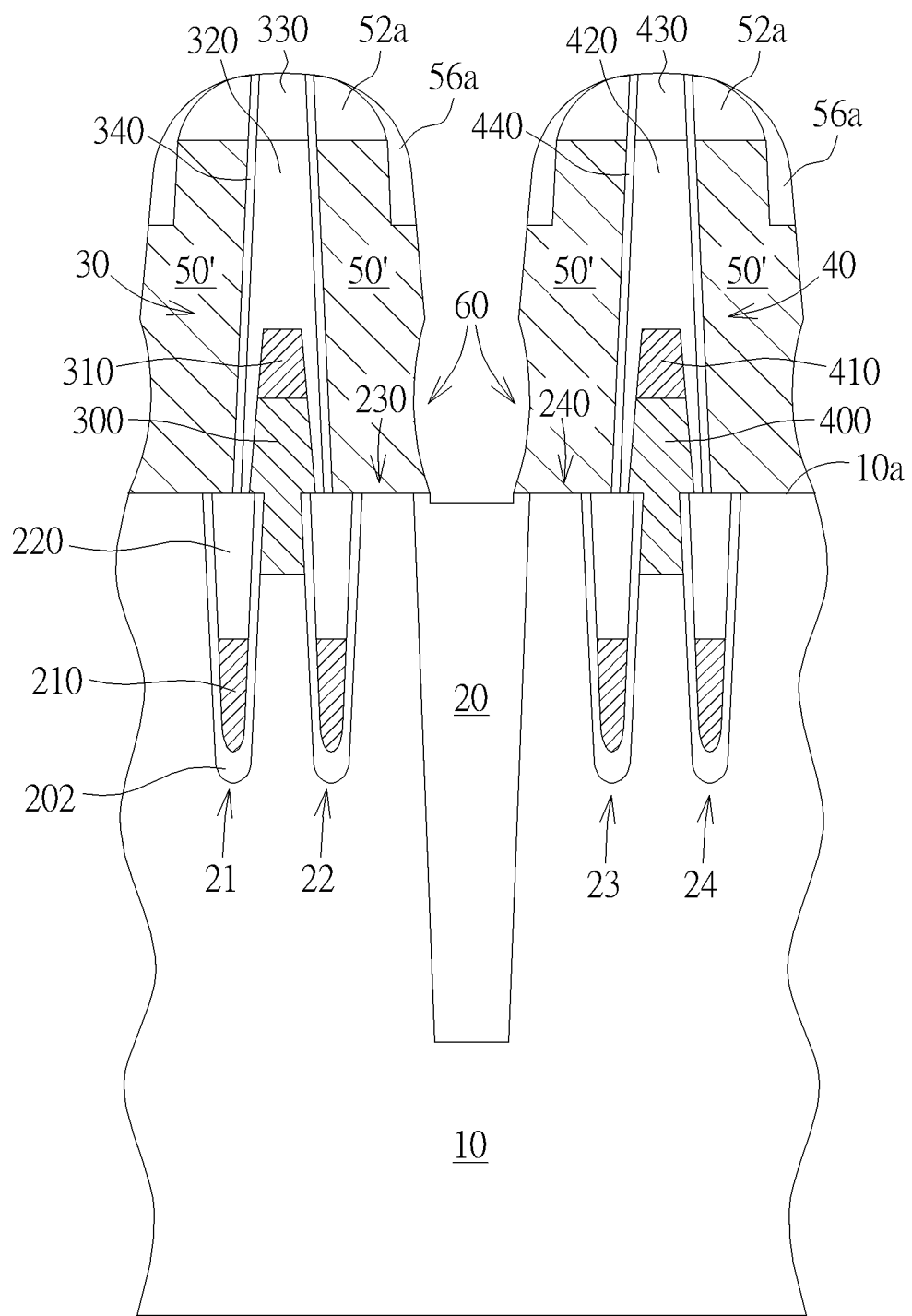

As shown in FIG. 9, according to the illustrative embodiment, an anisotropic dry etching process is then performed to etch the spacer layer 56, thereby forming spacers 56a on the spacers 52a respectively. Subsequently, using the spacers 56a and the spacers 52a as an etching hard mask, an etching process is then performed to etch the remaining polysilicon layer 50 not covered by the spacers 56a and the spacers 52a until the STI structure 20 is revealed, thereby forming split cell contact structures 50' on the cell contact regions 230 and 240 respectively. Optionally, an over etch may be performed to form an inwardly curved sidewall profile 60.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A split contact structure, comprising:
   a semiconductor substrate having a major surface;
   a first upwardly protruding structure disposed on the major surface;
   a first cell contact region in the major surface and being close to the first upwardly protruding structure;
   a second upwardly protruding structure disposed on the major surface;
   a second cell contact region in the major surface and being close to the second upwardly protruding structure;
   a shallow trench isolation (STI) region between the first cell contact region and the second cell contact region; wherein the first cell contact region and the second cell contact region are both in contiguous with the STI region;
   a first patterned layer stacked on the first upwardly protruding structure;

a second patterned layer stacked on the second upwardly protruding structure;

a first contact structure disposed on a sidewall of the first upwardly protruding structure and being in direct contact with the first cell contact region, wherein the first patterned layer protrudes from a top surface of the first contact structure; and a second contact structure disposed on a sidewall of the second upwardly protruding structure and being in direct contact with the second cell contact region, wherein the second patterned layer protrudes from a top surface of the second contact structure.

2. The split contact structure according to claim 1, wherein the first and second upwardly protruding structures extend along a first direction and the first and second patterned layers have a line-shaped pattern and extend along a second direction, wherein the first direction is perpendicular to the second direction.

3. The split contact structure according to claim 1 further comprising a dual-spacer structure on the first or second contact structure.

4. The split contact structure according to claim 1, wherein the first and second contact structure comprises an inwardly curved sidewall profile.

5. The split contact structure according to claim 1, wherein the first and second patterned layers are silicon oxide layers.

6. The split contact structure according to claim 1, wherein the first and second upwardly protruding structures comprise a silicon lower portion, a metal portion directly on the silicon lower portion, and a silicon nitride layer stacked on the metal portion and covering the sidewalls of the metal portion.

* * * * *